(12) United States Patent
Yoshida et al.

(10) Patent No.: US 9,334,580 B2
(45) Date of Patent: May 10, 2016

(54) MANGANESE OXIDE PARTICLES AND PROCESS FOR PRODUCING SAME

(75) Inventors: Mami Yoshida, Saitama (JP); Kenji Suzuoka, Saitama (JP); Kazuhiko Kato, Saitama (JP); Yasunori Tabira, Saitama (JP); Isamu Yashima, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 577 days.

(21) Appl. No.: 13/699,404

(22) PCT Filed: Jul. 8, 2011

(86) PCT No.: PCT/JP2011/065664
§ 371 (c)(1),
(2), (4) Date: Nov. 21, 2012

(87) PCT Pub. No.: WO2012/023357
PCT Pub. Date: Feb. 23, 2012

(65) Prior Publication Data
US 2013/0202521 A1    Aug. 8, 2013

(30) Foreign Application Priority Data
Aug. 19, 2010    (JP) .................................. 2010-183886

(51) Int. Cl.
*C01G 45/02* (2006.01)
*C30B 7/14* (2006.01)
*H01M 4/505* (2010.01)
*C30B 29/16* (2006.01)

(52) U.S. Cl.
CPC . *C30B 7/14* (2013.01); *C01G 45/02* (2013.01); *C30B 29/16* (2013.01); *H01M 4/505* (2013.01); *C01P 2002/72* (2013.01); *C01P 2002/76* (2013.01); *C01P 2002/77* (2013.01);

(Continued)

(58) Field of Classification Search
CPC .......... C30B 7/14; C30B 29/16; C01G 45/02; C01P 2002/72; C01P 2002/76; C01P 2002/77; C01P 2004/62; C01P 2006/40; Y02E 60/122; H01M 4/505
See application file for complete search history.

(56) References Cited

U.S. PATENT DOCUMENTS 5,672,329 A * 9/1997 Okada .................... C01G 45/02
                                                            423/594.14
6,482,374 B1 * 11/2002 Kumar ................... B82Y 30/00
                                                            423/179.5

(Continued)

FOREIGN PATENT DOCUMENTS

JP    2001-048546    2/2001
JP    2005-314152    11/2005

(Continued)

OTHER PUBLICATIONS

Chukhrov (NPL: "Manganese Minerals in Clays: A Review", Clays and Clay minerals, vol. 28, No. 5 pp. 346-354, 1980).*

(Continued)

*Primary Examiner* — Melvin C Mayes
*Assistant Examiner* — Smita Patel
(74) *Attorney, Agent, or Firm* — Young & Thompson (57) ABSTRACT

A manganese oxide particle having a hexagonal crystal structure or an analogous hexagonal crystal structure with an a-axis length of 8.73±1 Å and a c-axis length of 14.86±1 Å. The manganese oxide particle is preferably produced by a process including mixing an aqueous solution containing manganese (II) and an organic compound having a hydroxyl group while in a heated state with an alkali.

2 Claims, 3 Drawing Sheets (52) U.S. Cl.
CPC ......... *C01P2004/62* (2013.01); *C01P 2006/40* (2013.01); *Y02E 60/122* (2013.01); *Y02P 70/54* (2015.11)

(56) References Cited

U.S. PATENT DOCUMENTS

2004/0011252 A1* 1/2004 Sturgill .............. C01G 45/1221
                                                                    106/401
2008/0193847 A1    8/2008 Suetsugu et al.

FOREIGN PATENT DOCUMENTS

JP    2007-077018    3/2007
JP    2009-135067    6/2009

OTHER PUBLICATIONS

International Search Report, PCT/JP2011/065664, Aug. 16, 2011.

* cited by examiner

MANGANESE OXIDE PARTICLES AND PROCESS FOR PRODUCING SAME

TECHNICAL FIELD

This invention relates to novel manganese oxide particles having a layer structure and a process for producing the same.

BACKGROUND ART

Conventional techniques relating to manganese oxide having a layer structure include the technique described in patent literature 1 below. The manganese oxide disclosed therein is a manganese dioxide nanobelt having a layer structure. Patent literature 1 describes the manganese dioxide nanobelt as being capable of intercalating and deintercalating cations with ease. The manganese dioxide nanobelt is produced by wet synthesis using an aqueous alkali solution, more specifically by heating dimanganese trioxide powder in an aqueous sodium hydroxide solution at a temperature ranging from 150° to 200° C. for 72 hours or longer.

There is another known method for producing an oxide of manganese by wet synthesis using an aqueous alkali solution, which includes the steps of adding an ammoniacal alkaline solution, a hydrogen peroxide solution, or the like to a solution containing manganese ions to form a precipitate of manganese hydroxide, separating the precipitate from the mother liquid, dispersing the separated precipitate in an organic solvent, and drying and grinding the precipitate at 120° C. or lower (see patent literature 2 below).

Apart from these techniques, patent literature 3 (see below) discloses a manganese dioxide crystal having a rock salt type crystal structure belonging to the cubic system (space group Fm-3 m). The manganese dioxide crystal is described as being useful as a high-capacity electrode material with a higher volumetric energy density than manganese dioxide having a conventional crystal structure.

Apart from the manganese dioxide described in patent literature 3, non-patent literature 1 below reports manganese dioxide having a hexagonal crystal structure with an a-axis length of 11.08 Å and a c-axis length of 4.45 Å.

CITATION LIST

Patent Literature

Patent literature 1: JP 2005-314152A
Patent literature 2: JP 2001-48546A
Patent literature 3: JP 2007-77018A

Non Patent Literature

Non-patent literature 1: Hanzawa, et al., DENCHI GIJYUTU, The Committee of Battery Technology, The Electrochemical Society of Japan, vol. 9, pp. 3-11, 1997

SUMMARY OF INVENTION

Technical Problem

The manganese dioxide nanobelt described in patent literature 1 has a what we call birnessite-type crystal structure. The crystal structure per se is known. The oxide of manganese described in patent literature 2 is composed of $MnO_2$, $Mn_2O_3$, $Mn_3O_4$, and the like, and the crystal structure of which is also known. The manganese dioxide crystal described in patent literature 3 is obtained by releasing lithium ions from lithium manganese oxide $LiMnO_2$. This method is not practical for industrial production because the lithium ion release is performed under a microscope using a microelectrode system.

An object of the invention is to provide manganese oxide particles having a novel crystal structure and a process for producing the same.

Solution to Problem

The invention provides manganese oxide particles characterized by having a hexagonal crystal structure or an analogous hexagonal crystal structure with an a-axis length of 8.73±1 Å and a c-axis length of 14.86±1 Å.

The invention also provides a preferred process for producing the manganese oxide particles. The process includes mixing an aqueous solution containing manganese (II) and an organic compound having a hydroxyl group, while in a heated state, with an alkali.

The invention provides another preferred process for producing the manganese oxide particles. The process includes mixing an aqueous solution containing manganese (II), while in a heated state, with an amount of an alkali. The amount is such that generates $OH^-$ in an amount 0.1 to 3.0 times the number of moles of the manganese (II).

Advantageous Effects of Invention

The novel manganese oxide particles provided by the invention are useful as a positive electrode material of lithium secondary batteries; a gas fixation material; semiconductor material parts; abrasives used to polish glass plates, glass hard disks, silicon substrates for device fabrication, silicon carbide substrates, gallium nitride substrates, sapphire substrates for LED production, silicon carbide substrates, and the like; inorganic ion exchangers; ion sieves; catalysts; and so on.

DESCRIPTION OF EMBODIMENTS

The invention will be described based on its preferred embodiments. The manganese oxide particle of the invention is characterized by having a hexagonal crystal structure or an analogous hexagonal crystal structure (hereinafter inclusively referred to as "hexagonal crystal" or "hexagonal crystal structure"). A hexagonal crystal structure is a type of layered crystal structures. Manganese oxide having a hexagonal crystal structure is known from non-patent literature 1 cited supra. However, the manganese oxide of non-patent literature 1 is an obviously different substance from the manganese oxide of the invention. That is, the manganese oxide of the invention is a novel substance. Other crystal structures so far known for manganese oxides include a cubic for manganese (II) oxide, dimanganese (III) trioxide, and manganese (IV) dioxide; a tetragonal for dimanganese (III) trioxide and manganese (IV) dioxide; and an orthorhombic for manganese (IV) dioxide. As used herein, the term "an analogous hexagonal crystal structure (a structure similar to a hexagonal crystal structure)" refers to a crystal structure showing a layer structure when observed from a certain direction, such as the monoclinic structure of mica.

The manganese oxide particle of the invention, which has a hexagonal crystal structure, has an a-axis length of 8.73±1 Å and a c-axis length of 14.86±1 Å.

The manganese oxide particle of the invention, which has the above-specified crystal structure, has a powder XRD (Cu/Kα) pattern showing diffraction peaks at a 2θ angle of at least 11.9±1°, 24.0±1°, and 36.3±1°. None of the conventionally known manganese oxides, such as MnO, $MnO_2$, and $Mn_2O_3$, has peaks at all of these angles. The inventors conducted crystal structural analysis on the manganese oxide particle of the invention based on the powder XRD pattern and found as a result that the peaks at 11.9±1°, 24.0±1°, and 36.3±1° 2θ are assigned to the (002) plane, (004) plane, and (006) plane, respectively, of the manganese oxide.

The above recited crystal structure and lattice lengths are determined through structural analysis based on the powder XRD pattern. The structural analysis in the invention was conducted using computer software Expo2009 developed by an Italian development organization, Instituto di Cristallografia.

In addition to the above diffraction peaks, the manganese oxide particle of the invention has peaks at a 2θ angle of 16.7°, 20.3°, 23.6°, 26.7°, 31.3°, 31.6°, 31.9°, 33.6°, 33.8°, 39.8°, 43.4°, 44.0°, 48.4°, 48.7°, 54.5°, 55.4°, 55.7°, 59.0°, 59.4°, 65.3°, 66.7°, and 68.3°, each with a discrepancy of ±1°.

Powder XRD is performed in accordance with the following procedure. A powder X-ray diffractometer RINT-TTRIII from Rigaku Corp. is used. Powder prepared in the manner, e.g., of Example 1 is put in a dedicated glass holder and analyzed by powder XRD under the following conditions:
Measuring range: 2θ (CuKα/degree)=from 5° to 80°
Tube voltage: 50 kV
Tube current: 300 mA
Angle increment: 0.02°
Scanning rate: 4°/min The valence of manganese in the manganese oxide particle of the invention is assumed to be 2 from the results of chemical analysis (oxalic acid solution method) and electron spin resonance spectroscopy (ESR) performed by the inventors. Identification of divalent manganese by chemical analysis (oxalic acid solution method) is carried out according to the following procedure (JIS K1467).

In a Erlenmeyer flask are put 0.25 g of manganese oxide particles (sample) and 50 ml of an oxalic acid aqueous solution (0.96%), and the system was heated to 55° to 60° C. to dissolve the sample. Oxalic acid reduces manganese ions to two-valent manganese and dissolves the manganese. Residual oxalic acid not used in the reduction reaction is titrated with a 0.1 M $KMnO_4$ aqueous solution to calculate the amount of reduction reaction in the harvested sample. The valency of the manganese oxide particles is obtained from the amount of reduction reaction and the Mn content separately determined by ICP. When the amount of the oxalic acid used to dissolve the sample and the amount of oxalic acid determined by the titration with a aqueous solution are substantially equal, the valence of manganese in the manganese oxide particles (sample) is judged to be two.

Identification of divalent manganese by ESR is carried out according to the following procedure.

An ESR spectrometer Elexsys E580 from Bruker is used. Sample powder is put in a 4 mm-diameter quartz tube and analyzed to confirm whether signals due to $Mn^{2+}$ (g≥2) are detected with the following parameters: measuring temperature, 25° C.; center magnetic field intensity, 5050 G; magnetic field sweep range, 10000 G; modulation, 100 kHz, 5 G; microwave, 9.441 GHz, 1 mW; sweep time, 335.54 s; number of sweeps, 1; time constant, 163.84 ns; number of data points, 2048; cavity, $TE_{011}$ mode cylindrical cavity.

It is preferred for the manganese oxide particle of the invention to contain manganese as a sole metal element and only oxygen (in some cases only oxygen and hydrogen) as an element other than manganese and to be substantially free from a dopant element, i.e., non-doped. The manganese oxide particle of the invention which is non-doped exhibits enhanced performance without using any dopant elements of various kinds that are expensive and uneconomical or environmentally unfriendly. Examples of conceivable dopant elements include Nb, Ta, Sb, W, P, Ni, Co, Bi, and Li. As used herein, the term "substantially free from a dopant element" is intended to mean that any dopant element is not intentionally added. In other words, unintentional incorporation of a trace amount of a dopant element during the preparation of the manganese oxide particles is acceptable.

As stated, the manganese oxide particle of the invention preferably contains no dopant element. Nevertheless, a dopant element may be added depending on the particular use of the particle. In the cases where the manganese oxide particle contains a dopant element, the ratio of the dopant element is preferably 0.01 to 45 mol %, more preferably 0.05 to 35 mol %, as represented by (the number of moles of dopant element)/(the number of moles of dopant element+the number of moles of manganese)×100, for obtaining increased electroconductivity of the manganese oxide particle without impairing economic efficiency. In such cases, one or more of the above recited elements may be used as the dopant element.

The manganese oxide particles of the invention preferably have an average primary particle diameter of 1 to 20000 nm, more preferably 3 to 10000 nm, even more preferably 3 to 5000 nm, as determined by observation under a scanning electron microscope (SEM). The average particle diameter is obtained by measuring the length of at least 10 (n≥10) manganese oxide particles on an SEM image taken at a magnification of 5000 to 20000 and dividing the sum of the lengths by the number of samples, n.

A preferred process for producing the manganese oxide particles of the invention will then be described. The process of the invention starts with divalent manganese and includes the steps of dissolving a starting material in water together with an organic compound having a hydroxyl group to prepare a mixed aqueous solution, heating the mixed aqueous solution, and mixing the mixed aqueous solution while in the heated state with an alkali (basic substance). The process will be described in sequence.

To start with, a water soluble compound of divalent manganese is prepared. Examples of useful water soluble, divalent manganese compounds include manganese (II) sulfate, manganese (II) chloride, and manganese (II) nitrate. The divalent manganese ion concentration in the mixed aqueous solution may be preferably 0.01 to 3 mol/L, more preferably 0.05 to 1.5 mol/L.

Separately, an organic compound having a hydroxyl group (hereinafter "hydroxyl-containing organic compound") is prepared. The organic compound can be a low-molecular compound or a high-molecular compound. A low-molecular, hydroxyl-containing organic compound is exemplified by a monohydric alcohol, which may be aliphatic, alicyclic, or aromatic. Examples of aliphatic monohydric alcohols include monohydric lower alcohols having, e.g., 1 to 6 carbon atoms, such as methanol, ethanol, n-butanol, and n-hexanol. Examples of alicyclic monohydric alcohols are cyclohexanol and terpineol. Examples of aromatic monohydric alcohols include benzyl alcohol.

A high-molecular, hydroxyl-containing organic compound is exemplified by polyvinyl alcohol and polyols. The polyvinyl alcohol may be of either complete saponification type or partial saponification type and may be either polyvinyl alcohol per se or modified polyvinyl alcohol. Examples of useful modified polyvinyl alcohols include carboxyl-modified, alkyl-modified, acetoacetyl-modified, acrylic acid-modified, methacrylic acid-modified, pyrrolidone-modified, vinylidene-modified, or silanol-modified polyvinyl alcohol. The polyvinyl alcohol preferably has an average polymerization degree of 200 to 30000, more preferably 500 to 10000. The polymerization degree may be determined by, for example, size exclusion chromatography (SEC). Examples of useful polyols include ethylene glycol, diethylene glycol, triethylene glycol, polyethylene glycol, polypropylene glycol, propanediol, butanediol, pentanediol, hexanediol, glycerol, hexanetriol, butanetriol, and petriol (3-methylpentane-1,3,5-triol).

In the case when the hydroxyl-containing organic compound group is a monohydric lower alcohol, the concentration of the organic compound in the mixed aqueous solution is preferably 0.005% to 30%, more preferably 0.01% to 10%, by weight. When used in concentrations within that range, the hydroxyl-containing organic compound will exhibit sufficient effect to advantage, and problems such as thickening are less likely to arise, whereby intended manganese oxide particles with a uniform particle size are obtained successfully. When in using a high-molecular compound as the hydroxyl-containing organic compound, the concentration of the organic compound is preferably 0.005% to 10%, more preferably 0.01% to 5%, by weight, for the same reasons.

The ratio of divalent manganese to the hydroxyl-containing organic compound in the mixed aqueous solution is, being represented by Mn/OH molar ratio, preferably 0.01 to 1000, more preferably 0.03 to 500. Within that range, it is less likely that unreacted Mn ions remain in the liquid and that by-products such as $Mn_3O_4$ and $Mn(OH)_2$ precipitate.

The resulting mixed aqueous solution containing divalent manganese and the hydroxyl-containing organic compound is heated. The heating temperature is preferably 50° to 105° C., more preferably 70° to 100° C. Within that range of heating temperature, desired manganese oxide particles will be produced without using a pressure vessel, such as an autoclave, while preventing unintended by-production of $Mn(OH)_2$ or $Mn_3O_4$.

An alkali (basic substance) is then added to the mixed aqueous solution while in the heated state at a temperature within the recited range. The mixed aqueous solution, which is on the acidic side, is neutralized by an alkali. By this operation, divalent manganese is neutralized. Examples of the alkali include alkali metal hydroxides, such as sodium hydroxide and potassium hydroxide; alkaline earth metal hydroxides, such as magnesium hydroxide; carbonates, such as $NaHCO_3$ and $NH_4HCO_3$; and ammonia. The amount of the alkali (base) to be mixed into the mixed aqueous solution containing manganese (II) and the hydroxyl-containing organic compound while being in a heated state is preferably such that generates $OH^-$ in an amount 0.1 to 3.0 times, more preferably 0.1 to 2.0 times, the number of moles of the manganese (II). The pH of an aqueous solution of the alkali is preferably such that the mixed aqueous solution having the alkali added thereto may have a pH of 2 to 12, more preferably 4 to 11, even more preferably 7 to 11. When the mixed aqueous solution has a pH falling within that range, desired manganese oxide particles are obtained with ease. The upper limit of the pH is preferably 9 or smaller, more preferably 8.7 or smaller. When the pH is 9 or smaller, by-production of $Mn(OH)_2$, etc. is suppressed.

Addition of the aqueous alkali solution to the mixed aqueous solution containing divalent manganese and the hydroxyl-containing organic compound is preferably performed slowly over a predetermined period of time. It should be noted that adding the aqueous alkali solution all at once can result in a failure to form desired manganese oxide particles. When the aqueous alkali solution is added slowly, the rate of addition is preferably controlled so that the pH of the mixed aqueous solution may be maintained within the range recited above.

Manganese oxide particles as desired are thus formed in the liquid. The resulting liquid system may contain a by-product, such as an oxyhydroxide, a hydroxide, or an oxide of manganese. These by-products are preferably removed. Because the by-products are finer than the desired manganese oxide particles, they can be separated by water elutriation making use of the difference in settling velocity of particles. In order to remove the by-products more certainly, it is advisable to repeat water elutriation a plurality of times or conduct water elutriation after finely dispersing the by-products in the liquid by ultrasonication or high-speed agitation.

The thus collected manganese oxide particles can easily be freed of impurities by, for example, repulping with water. To sufficiently remove impurities, repulping with water is preferably carried out until the electroconductivity of the dispersing medium (water) decreases to 2000 µS/cm or less, more preferably 1000 µS/cm or less.

The filtration cake after repulping is dried in a hot air drier, disintegrated, and classified to obtain desired manganese oxide particles. The desired manganese oxide particles are also be obtained by drying the filtration cake after repulping at 100° C. or lower under reduced pressure. The drying under reduced pressure is preferably carried out at 5 hPa or less, at 20° to 100° C., for 3 to 12 hours. The hot air drying may induce change of valence of manganese during drying, resulting in the formation of impurity. This problem is avoided in the case of drying under reduced pressure.

The manganese oxide particles of the invention can be finely dispersed in an aqueous medium by, for example, wet disintegrating a dispersion of the manganese oxide particles having been washed to a prescribed electroconductivity by repulping. The disintegration operation may be implemented by the use of, for example, a media mill, e.g., a bead mill. It is preferred to carry out the disintegration operation in the presence of a pH adjustor of various kinds to help to obtain manganese oxide particles as close to a monodisperse state as possible. A pH adjustor may be added after disintegration. A pH adjustor capable of adjusting the pH of the dispersion to 5 to 12 is preferably used. Examples of such a pH adjustor include acids, such as inorganic acids (e.g., hydrochloric acid, sulfuric acid, and nitric acid) and carboxylic acids (e.g., acetic acid and propionic acid), and alkalis, such as aqueous ammonia and organic amines (e.g., ethanolamine).

Through the above operations is obtained a dispersion of manganese oxide in water as a dispersing medium. Where needed, the dispersion may be filtered to remove coarse particles. The manganese oxide dispersion preferably contains the manganese oxide particles in a concentration of 0.1% to 50%, more preferably 1% to 40%, by weight.

The above described process, in which manganese oxide is produced in a liquid phase (water), easily yields a manganese oxide dispersion with high dispersibility and low agglomeration as compared with the conventional processes in which manganese oxide obtained by firing is pulverized and then slurried into sol. The thus obtained dispersion can be used as an abrasive slurry for polishing various substrates.

As an alternative to the above process in which a hydroxyl-containing organic compound is used in the synthesis of desired manganese oxide, there is another process in which such a hydroxyl-containing organic compound is not used. In this process, too, an amount of an alkali (base) is mixed into an aqueous solution containing manganese (II) while in a heated state, the amount of the alkali to be added being such that generates $OH^-$ in an amount 0.1 to 3.0 times, preferably 0.1 to 2.0 times, the number of moles of the manganese (II). The aqueous solution containing manganese (II) that can be used in this process may be the same as the aqueous solution containing manganese (II) used in the earlier described process. So is the alkali.

In this process, an aqueous solution containing manganese (II) (not containing a hydroxyl-containing organic compound) is heated. The heating temperature is preferably 50° to 105° C., more preferably 70° to 100° C. An alkali is added to the so heated aqueous solution, whereupon divalent manganese is neutralized. Specifically, it is necessary to add the alkali in an amount falling within the range recited above. If the alkali (base) is added in such an amount that generates $OH^-$ of an amount more than three times the number of moles of the manganese (II), an inconvenience will occur in which by-products such as $Mn(OH)_2$ form easily.

It is preferred that the aqueous alkali solution be added to the aqueous solution of divalent manganese slowly over a prescribed period of time similarly to the manner of addition in the earlier described process using the hydroxyl-containing organic compound. The pH of an aqueous solution of the alkali is preferably such that the mixed aqueous solution after the alkali addition may have a pH of 2 to 12, more preferably 4 to 11, even more preferably 7 to 11. When the mixed aqueous solution has a pH falling within that range, desired manganese oxide particles are obtained with ease. The upper limit of the pH is preferably 9 or smaller, more preferably 8.7 or smaller. When the pH is 9 or smaller, by-production of $Mn(OH)_2$, etc. is suppressed.

Manganese oxide particles as desired are thus formed in the liquid. Thereafter, the resulting liquid is worked up in the same manner as in the aforementioned process using the hydroxyl-containing organic compound. In this process, manganese oxide particles of the invention may also be collected by decantation washing, followed by solid-liquid separation because the desired manganese oxide particles form in the liquid as a precipitate and, in addition, the liquid contains a smaller amount of by-products.

Two processes for the synthesis of the desired manganese oxide have been described; one using a hydroxyl-containing organic compound, and the other not. The process using a hydroxyl-containing organic compound is advantageous in that the manganese oxide particles obtained are less liable to deterioration during dry powder storage. The process not using a hydroxyl-containing organic compound is economically advantageous whereas the inhibitory effect on deterioration obtained by the process using a hydroxyl-containing organic compound is not obtained. Even the manganese oxide particles obtained by the process not using a hydroxyl-containing organic compound can be prevented from deterioration during dry powder storage by storing under protection from high temperature and high humidity, preferably at a temperature of −20° to 30° C. and a relative humidity of 50% or less. In either process, reduction in the amount of the alkali tends to result in reduced yield but provides an advantage of producing a single-phase manganese oxide with ease. More specifically, single-phase manganese oxide is obtained more easily when the alkali is added to result in a pH of the mixed aqueous solution of 9 or smaller, preferably 7 to 9, in both the process using a hydroxyl-containing organic compound and the process not using a hydroxyl-containing organic compound.

The thus obtained manganese oxide particles are useful in a broad range of applications, taking advantage of the layered crystal structure, such as a positive electrode material of lithium secondary batteries; a gas fixation material; semiconductor material parts; abrasives used to polish glass plates, glass hard disks, silicon substrates for device fabrication, silicon carbide substrates, gallium nitride substrates, sapphire substrates for LED production, silicon carbide substrates, and the like; inorganic ion exchangers; ion sieves; catalysts; coatings; inks; and emulsions.

EXAMPLES

The invention will now be illustrated in greater detail by way of Examples, it being understood that the invention is not limited thereto. Unless otherwise noted, all the percents are by weight.

Example 1

In 492.2 g of pure water was dissolved 7.82 g of sodium hydroxide to prepare an aqueous alkali solution for neutralization. Separately, 0.5 g of polyvinyl alcohol (average degree of polymerization: 1500; degree of saponification: 86 to 90 mol %; hereinafter referred to as PVA) was added to 100.0 g of pure water in a 200 ml beaker and heated to 60° C. to dissolve to prepare an aqueous PVA solution. In another beaker was put 371.8 g of pure water, and 27.73 g of manganese sulfate pentahydrate was dissolved therein to prepare an aqueous manganese solution. The whole amount of the aqueous PVA solution was poured into the aqueous manganese solution, followed by thoroughly stirring to make a mother liquid.

The mother liquid was heated to 90° C. with stirring using a paddle stirrer, and the whole amount of the above prepared aqueous alkali solution was fed thereto at a rate of about 5 ml/min using a tube pump. The pH of the mother liquid during the addition was between 9 and 10. After completion of the addition of the aqueous alkali solution, the system was allowed to age for 10 minutes to obtain a dispersion of manganese oxide particles.

Figure 1:
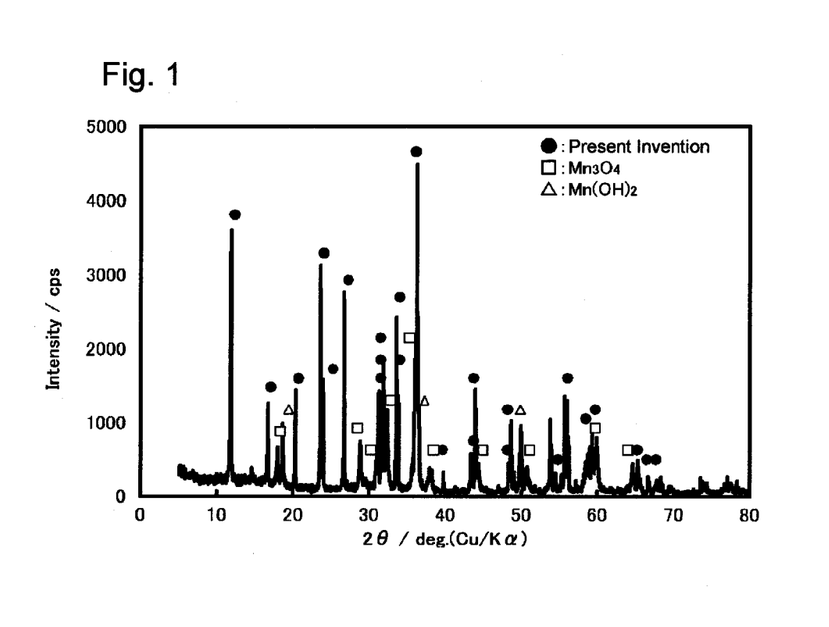
FIG. 1 is a powder XRD pattern of the manganese oxide particles obtained in Example 1.

The dispersion was filtered through filter paper (Advantec Grade No. 5C), and the filter cake was washed by pouring one liter of pure water. The cake was repulped with pure water, filtered, and washed by pouring water. These operations were repeated three times. The washed cake was dried in a hot air dryer set at 120° C. for 10 hours, disintegrated in an agate mortar, and sieved through a SUS mesh screen having an opening size of 75 μm. The resulting powder was analyzed by powder XRD. The results obtained are shown in FIG. 1. As is apparent from the results in FIG. 1, there appeared high-intensity, sharp peaks with filled circles in addition to the peaks assigned to $Mn_3O_4$ and $Mn(OH)_2$. These peaks were found to be assigned to a hexagonal structure by using the computer software described supra. The a-axis length and the c-axis length of the crystals were obtained by the method of least squares based on the peaks observed at a 2θ angle between 5° to 80° indicated with filled circles in FIG. 1. As a result, a-axis length=8.73 Å, and c-axis length=14.86 Å. The average particle diameter was 0.5 μm as determined by the method described supra.

The results of chemical analysis on the resulting manganese oxide were: Mn=55.9%; O=42.2%; S=4.7%; and Na=0.001%. The chemical analysis was carried out by using an ICP-AES apparatus (SPS-3000, from SII NanoTechnology Inc.) for Mn and Na, an oxygen/nitrogen analyzer (EMGA-620, from Horiba, Ltd.) for oxygen, and a carbon/sulfur analyzer (EMIA-920V, from Horiba, Ltd.) for sulfur. The reason the total of the chemical analytical values exceeds 100% is that a sample was quantitatively analyzed by different methods. These analytical values are of the mixture of the desired manganese oxide and $Mn_3O_4$.

Figure 2:
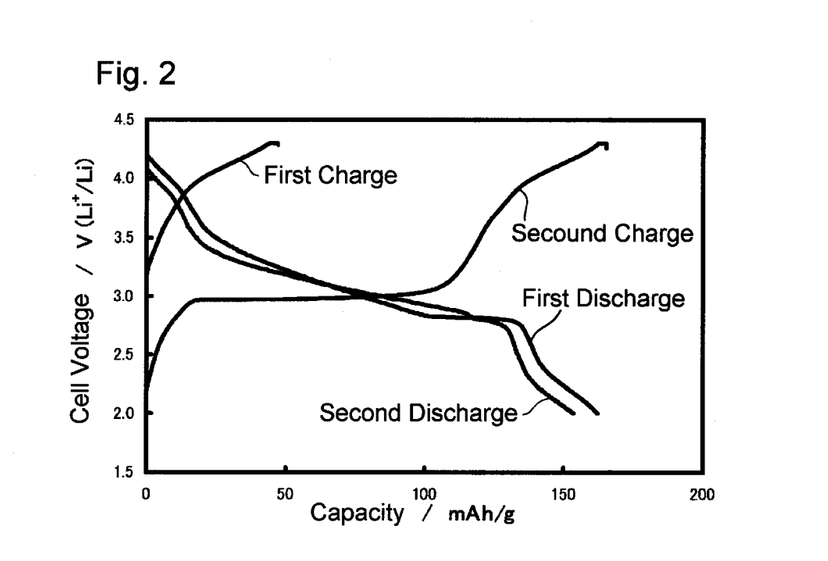
FIG. 2 is charge/discharge curves of a lithium secondary battery of which the positive electrode active material is obtained by mixing the manganese oxide particles of Example 1 and lithium nitrate and firing the mixture in the atmosphere at 400° C.

Usefulness of the manganese oxide particles obtained in Example 1 as a raw material of a positive electrode active material of lithium secondary batteries was verified as follows. The manganese oxide particles obtained in Example 1 weighing 2.50 g and 0.44 g of $LiNO_3$ were mixed well in a mortar, and the mixture was put in an alumina boat and fired in the atmosphere at 400° C. for 5 hours to give a positive electrode active material comprising lithium manganese complex oxide. The positive electrode active material (2.85 g), 0.15 g of acetylene black, and 0.33 g of polyvinylidene fluoride were mixed, and 3 g of N-methyl-2-pyrrolidinone was added thereto, followed by mixing in a defoaming mixer (from Thinky Corp.) to prepare a slurry. The slurry was applied to a side of 18 μm-thick copper foil and dried at 120° C. The coated copper foil was cut to a width of 6 cm, and a pressure of 2 ton was applied thereto using a roll press. A 14 mm diameter circle was stamped out from the foil, followed by drying in vacuo at 120° C. overnight to make a positive electrode. The amount of the positive electrode active material of the positive electrode was 6 mg/cm². A size 2032 coin cell was assembled in an argon atmosphere in a glove box using the resulting positive electrode, Li foil as a counter electrode, and, as an electrolyte, a 1 mol/L solution of $LiPF_6$ in a 1:1 (by volume) mixed solvent of ethylene carbonate and diethyl carbonate. The resulting coin cell was subjected to charge/discharge testing under the following conditions. The cell was charged at a constant current rate (0.175 mA/cm²) up to a voltage of 4.3 V (vs. $Li^+$/Li) and then at a constant voltage of 4.3 V until the current density reduced to 0.035 mA/cm². The cell was discharged at a constant current rate (0.175 mA/cm²) to a voltage of 2.0 V (vs. $Li^+$/Li). The test results are shown in FIG. 2. The results in FIG. 2 prove that the manganese oxide particles of the invention have a large charge/discharge capacity and, seeing that the first discharge capacity is 160 mAh/g and the second one is 154 mAh/g, a small reduction in capacity. These results reveal that the manganese oxide particles of the invention are useful as a positive electrode active material of a lithium secondary battery.

Comparative Example 1

Figure 3:
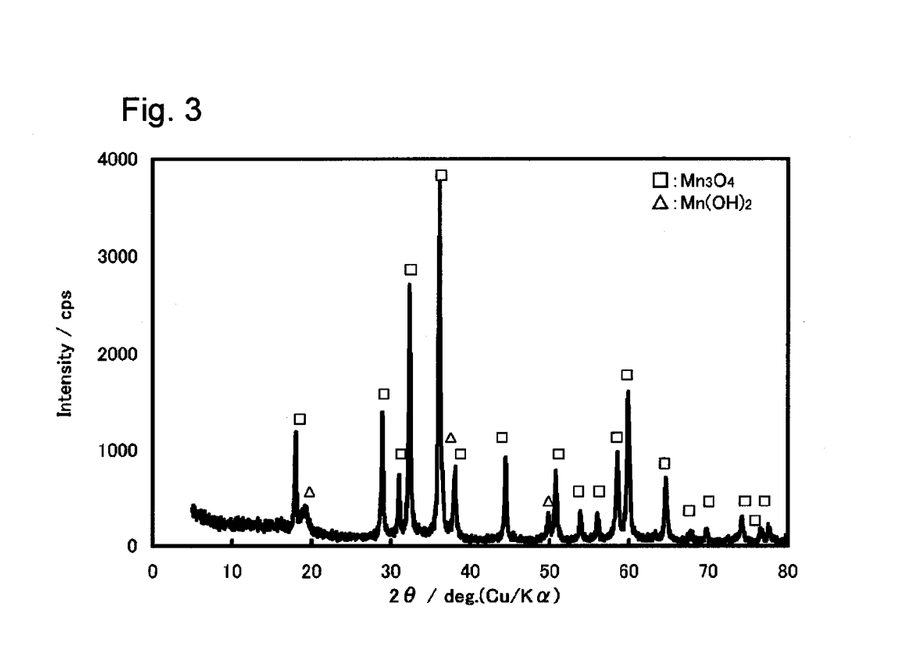
FIG. 3 is a powder XRD pattern of the particles obtained in Comparative Example 1.

Particles were obtained in the same manner as in Example 1, except that PVA was not used and that the amount of the alkali added was changed to such that would generate OH⁻ in an amount 3.5 times the number of moles of the manganese (II). A powder XRD pattern of the particles is shown in FIG. 3. As is apparent from FIG. 3, the particles obtained in Comparative Example 1 show only the peaks assigned to $Mn_3O_4$ and $Mn(OH)_2$ with no peaks assignable to other substances. The particles were subjected to the same chemical analysis as in Example 1. The results were: Mn=67.4%; O=30.5%; S=0.3%; and Na=0.018%.

Example 2

In 393.1 g of pure water was dissolved 6.9 g of sodium hydroxide to prepare an aqueous alkali solution for neutralization. Separately, 27.7 g of manganese sulfate pentahydrate was dissolved in 472.3 g of pure water to prepare an aqueous manganese solution (mother liquid). The mother liquid was heated to 90° C. with stirring using a paddle stirrer, and the whole amount of the aqueous alkali solution was fed thereto at a rate of about 5 ml/min using a tube pump. During the addition, the pH of the mother liquid was between 8 and 9. After completion of the addition of the aqueous alkali solution, the system was allowed to age for 10 minutes to obtain manganese oxide particles as a brown precipitate. The amount of the sodium hydroxide added was such that generated 1.5 moles of OH⁻ per mole of manganese (II).

Figure 4:
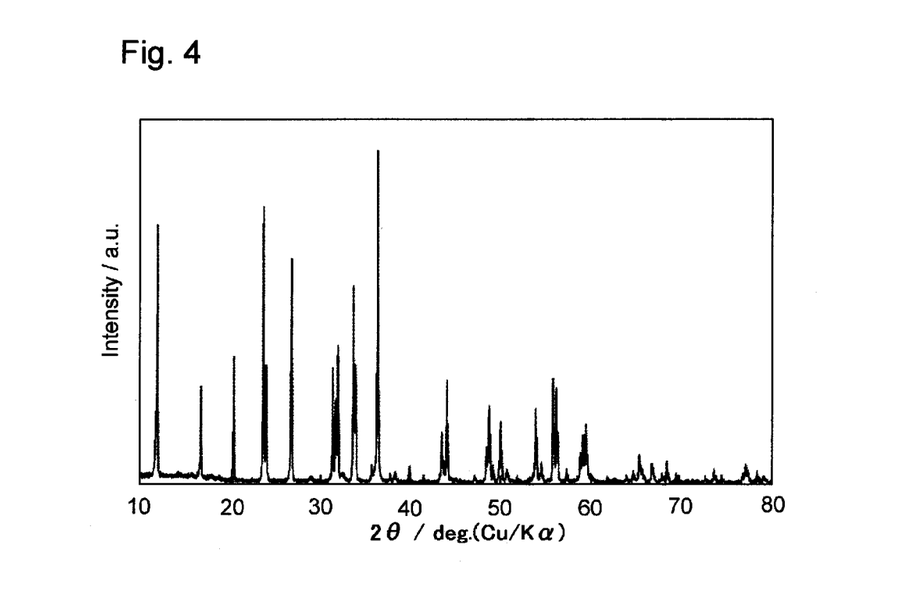
FIG. 4 is a powder XRD pattern of the manganese oxide particles obtained in Example 2.

The precipitate was washed with pure water by decantation until the supernatant liquor had an electroconductivity of 100 μS/cm or less. After the washing, the residue was filtered under reduced pressure, and the thus separated solid was dried in at 60° C. under reduced pressure (1 hPa or less) for 6 hours to give brown powder. The powder was analyzed by powder XRD to give a pattern shown in FIG. 4. As is apparent from FIG. 4, the XRD pattern showed high-intensity, sharp peaks corresponding to the peaks shown in FIG. 1 with filled circles (the powder XRD pattern of the manganese oxide powder of Example 1) with markedly fewer peaks assigned to $Mn_3O_4$ and $Mn(OH)_2$ than the pattern of FIG. 1. Of the peaks appearing in FIG. 4, those corresponding to the peaks indicated with filled circles in FIG. 1 were assigned by using computer software in the same manner as in Example 1 and found to be assigned to a hexagonal structure. The a-axis length and the c-axis length of the crystals were obtained by the method of least squares based on these peaks observed between 5° to 80° 2θ. As a result, a-axis length=8.713 Å, and c-axis length=14.82 Å. The average particle diameter was 0.4 μm as determined by the method described supra.

The resulting brown particles were subjected to chemical analysis in the same manner as in Example 1. The results were: Mn=54.3%; O=40%; S=5.9%; and Na=45 ppm.

Figure 5:
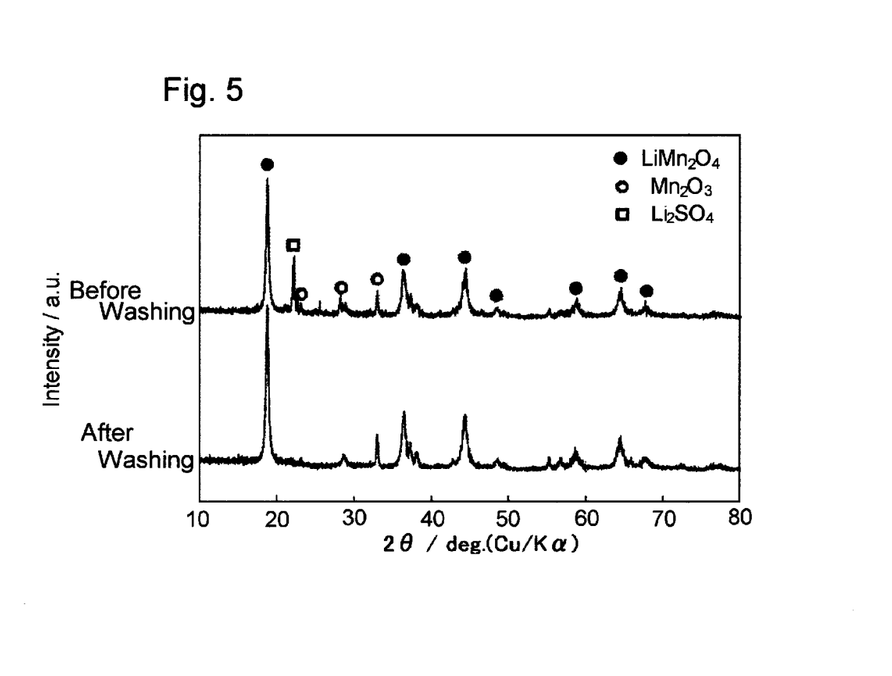
FIG. 5 is an XRD pattern of lithium manganese complex oxide before and after washing with pure water, the complex oxide being obtained by mixing the manganese oxide particles of Example 2 and lithium nitrate and firing the mixture in the atmosphere at 260° C. and then at 400° C.

Usefulness of the manganese oxide particles obtained in Example 2 as a raw material of a positive electrode active material of lithium secondary batteries was verified as follows. The manganese oxide particles obtained in Example 2 weighing 2.5 g and 1.49 g of $LiNO_3$ were mixed well in a mortar, and the mixture was put in an alumina boat and fired in the atmosphere at 260° C. for 5 hours and then at 400° C. for 5 hours to give lithium manganese complex oxide ($LiMn_2O_4$). The resulting lithium manganese complex oxide was analyzed by powder XRD to be found to contain $Li_2SO_4$ and $Mn_2O_3$ in addition to lithium manganese complex oxide. Then, in order to wash (to remove $Li_2SO_4$), the powder was suspended in pure water and stirred for 1 hour to dissolve $Li_2SO_4$, followed by solid-liquid separation, and the resulting solid was dried in the atmosphere at 120° C. for 3 hours. The XRD results obtained before and after the washing are shown in FIG. 5. It is seen from FIG. 5 that $Li_2SO_4$ had been removed by washing. Although $Mn_2O_3$ was not removed by washing, the presence of $Mn_2O_3$ causes no particular inconvenience when the lithium manganese complex oxide is used as a positive electrode active material in a lithium secondary battery. The sulfur content after the washing was found to be 0.4%.

Figure 6:
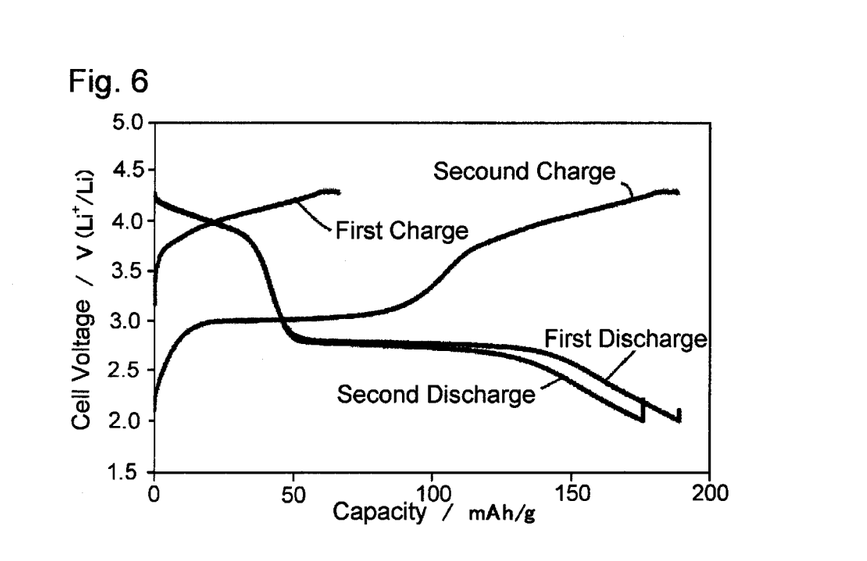
FIG. 6 is charge/discharge curves of a lithium secondary battery containing, as a positive electrode active material, the lithium manganese complex oxide obtained in Example 2 as washed with pure water (see FIG. 5).

A lithium ion cell was made in the same manner as in Example 1, except for using the washed lithium manganese complex oxide powder as a positive electrode active material. The resulting cell was subjected to charge/discharge testing. The results are shown in FIG. 6. As shown in FIG. 6, the lithium ion cell shows large discharge capacities (190 mAh/g in the first discharge and 178 mAh/g in the second discharge), proving that the manganese oxide particles of the invention are useful as a positive electrode active material of lithium ion batteries.

Test Example 1

The manganese oxide particles of each of Examples 1 and 2 were stored at 60° C. and 80% RH for 4 days, and the chemical structure of the particles after the storage was analyzed. As a result, the manganese oxide of Example 2 showed the formation of $Mn_3(OH)_2(SO_4)_2$ dihydrate and $Mn_3O_4$, whilst such a structural change was not observed with the particles of Example 1.

When the manganese oxide particles of Example 2 were stored in a dry state in a desiccator kept at 25° C., no structural change occurred even after 6 month or longer storage.

The invention claimed is:

1. A manganese oxide particle having a hexagonal crystal structure with an a-axis length of 8.73±1 Å and a c-axis length of 14.86±1 Å, and
   the manganese oxide particle has a powder XRD (Cu/Kα) pattern showing diffraction peaks at a 2θ angle of at least 11.9±1°, 24.0±1°, and 36.3±1°.

2. The manganese oxide particle according to claim 1, being substantially free from a dopant element.

\* \* \* \* \*